(12) United States Patent
Lin et al.

(10) Patent No.: US 9,198,296 B1
(45) Date of Patent: Nov. 24, 2015

(54) DOUBLE SIDED BOARD WITH BURIED ELEMENT AND METHOD FOR MANUFACTURING THE SAME

(71) Applicant: KINSUS INTERCONNECT TECHNOLOGY CORP., Taoyuan (TW)

(72) Inventors: Ting-Hao Lin, Taipei (TW); Yu-Te Lu, Taoyuan Hsien (TW); Fu-Song Chen, Tainan (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 14/590,235

(22) Filed: Jan. 6, 2015

(51) Int. Cl.
  *H05K 1/18* (2006.01)
  *H05K 1/03* (2006.01)
  *H05K 1/11* (2006.01)
  *H05K 1/02* (2006.01)

(52) U.S. Cl.
  CPC .............. *H05K 1/183* (2013.01); *H05K 1/0213* (2013.01); *H05K 1/115* (2013.01); *H05K 1/185* (2013.01); *H05K 1/0298* (2013.01)

(58) Field of Classification Search
  None
  See application file for complete search history.

(56) References Cited

U.S. PATENT DOCUMENTS

| 7,102,085 B2 * | 9/2006 | Ohta et al. | 174/260 |
| 2012/0133427 A1 * | 5/2012 | Kim et al. | 327/564 |
| 2015/0021074 A1 * | 1/2015 | Kim et al. | 174/258 |

* cited by examiner

*Primary Examiner* — Joseph Schoenholtz
(74) *Attorney, Agent, or Firm* — Lin & Associates Intellectual Property, Inc.

(57) ABSTRACT

A double sided board with buried element and a method for manufacturing the same are disclosed. At least one buried element is fixed on a dielectric layer and embedded in an insulation layer. First and second electrical circuits are formed on upper and lower surfaces of the insulation layer, respectively. At least one through-hole is formed in the insulation layer and filled with a conductive layer to electrically connect the first and the second electrical circuits. The dielectric layer beneath the buried element and the insulation layer above the buried element are provided with at least one opening, respectively, which is filled with the conductive layer, thereby connecting the conductive layer and external circuits or electrical elements. Additionally, the first and second electrical circuits are covered with first and second solder masks, respectively, so as to avoid environmental effect and improve preciseness of the circuits.

8 Claims, 5 Drawing Sheets

DOUBLE SIDED BOARD WITH BURIED ELEMENT AND METHOD FOR MANUFACTURING THE SAME

BACKGROUND OF THE INVENTION

1. Field of the Invention

The present invention generally relates to a double sided board with buried element and a method for manufacturing the same, and more specifically to a double sided board having specific electrical elements embedded in the insulation layer and electrically connected to external circuits via the opening in the insulation layer filled with a conductive layer, electrical circuits formed on the upper and lower surfaces of the insulation layer, which are electrically connected via the through-hole penetrating through the insulation layer and filled with the conductive layer, thereby improving preciseness of the circuit and electrical signal quality.

2. The Prior Arts

In the electronic industry, PCBs (printed circuit boards) are widely used to form electrical circuits and mount various electrical elements such as active, passive elements, power source, and so on. As well known, the PCBs not only provide stability of electrical operation but also prevent the electrical elements from detaching or being poor in contact so as to implement electrical function with excellent signal stability.

As the electrical function gets enhanced, the design of the PCB becomes more complex and tough under limited resources like area and volume. Thus, it is very crucial and challenging for the electronic industry to effectively suppress or block electrical interference and mount more elements on the board. Additionally, the design of the board having several layers of electrical circuits is needed to improve the circuit layout and save the layout area. For example, the double sided board provides the upper and lower surfaces to mount the required elements.

Moreover, the board manufactures have developed a specific process of manufacturing "embedded passives", which may further improve electrical quality and reduce the layout area. In general, the inner layer process for the multiple layer board is employed. The process of etching or printing can directly place the passive elements in the inner layer, and a multiple layer structure is formed through the pressing process. The above processes may replace traditional soldering treatments, thereby increasing packed density of the elements.

However, the above traditional schemes have a common drawback, in which some recesses are needed to form in the insulation material for placing the electrical elements. Regardless of laser drilling, mechanical drilling, chemical drilling or other process employed for the recesses, preciseness of the circuit is negatively affected and yield rate of the product thus decreases. As a result, the processing steps are more complex and it is adverse to mass production.

Therefore, it is greatly needed for the double sided board with buried element and the method for manufacturing the double sided board, in which the specific electrical elements are embedded in the insulation layer and electrically connected to the external circuits via the opening in the insulation layer filled with the conductive layer, and at the same time, the two electrical circuits respectively formed on the upper and lower surfaces of the insulation layer are electrically connected via the through-hole penetrating through the insulation layer and filled with the conductive layer, so as to simplify the whole structure and the processing steps, and greatly improve preciseness of the circuit and electrical signal quality, thereby overcoming the above problems in the prior arts.

SUMMARY OF THE INVENTION

The primary objective of the present invention is to provide a double sided board with buried element. The double sided board generally comprises an insulation layer, a dielectric layer, at least one buried element, a first electrical circuit, a second electrical circuit, a conductive layer, a first solder mask and a second solder mask. The buried element is fixed on the dielectric layer and embedded in the insulation layer. The first and second electrical circuits are provided on the upper and lower surfaces of the insulation layer, respectively. The insulation layer has through-hole penetrating through the insulation layer and filled with the conductive layer such that the first and second electrical circuits are electrically connected. The dielectric layer beneath the buried element and the insulation layer above the buried element have opening, which are filled with the conductive layer, such that the buried element is connected to external circuits or elements.

The first solder mask covers the bottom of the first electrical circuit and the bottom of the insulation layer, and the bottom of the through-hole is exposed. Similarly, the second solder mask covers the top of the second electrical circuit and the top of the insulation layer, and particularly, the top of the through-hole is also exposed. Thus, electrical insulation and protection are provided, and the first electrical circuit, the second electrical circuit and the buried element are kept from interference by the environment.

Another objective of the present invention is to provide a method for manufacturing double sided board with buried element.

First, a copper foil layer and a metal layer are sequentially stacked on a substrate. The metal layer is performed by a first patterning process to form a first electrical circuit and an opening. A dielectric layer is formed on the opening. At least one buried element is fixed on the dielectric layer.

Next, an insulation layer and a thin copper layer are stacked and then pressed into the first electrical circuit and the at least one buried element such that the at least one buried element is embedded in the insulation layer and does not contact the thin copper layer. The second patterning process is performed on the thin copper layer to form a second electrical circuit. The substrate and the thin copper layer are removed. At least one first opening is formed in the dielectric layer and the corresponding bottom of the buried element is exposed. Similarly, at least one second opening is formed in the insulation layer and exposes the corresponding top of the buried element. At the same time, at least one through-hole is formed and penetrates through the insulation layer.

A conductive layer is formed and covers the at least one first opening, the at least one second opening and the at least one through-hole such that the first electrical circuit is electrically connected to the second electrical circuit via the conductive layer in the at least one through-hole. Furthermore, a first solder mask is formed to cover the first electrical circuit and expose the at least one first opening and the at least one through-hole. Finally, a second solder mask is formed, covers the second electrical circuit and exposes the at least one second opening and the at least one through-hole, thereby finishing the double sided board with buried element of the present invention.

The double sided board of the present invention protects the buried element in the insulation layer so as to greatly improve electrical signal quality, operation reliability, and particularly simplify the manufacturing processes due to simpler structure, thereby reducing manufacturing cost.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
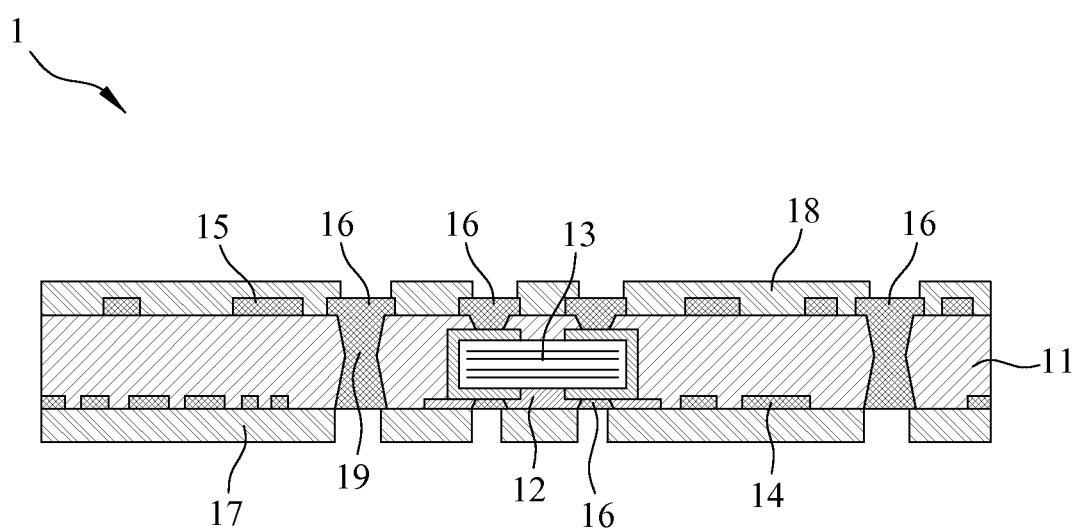
FIG. 1 is a view showing the double sided board with buried element according to one embodiment of the present invention.

Please refer to FIG. 1 showing the double sided board with buried element according to one embodiment of the present invention. As shown in FIG. 1, the double sided board 1 of the present invention generally comprises the insulation layer 11, the dielectric layer 12, at least one buried element 13, the first electrical circuit 14, the second electrical circuit 15, the conductive layer 16, the first solder mask 17 and the second solder mask 18. The insulation layer 11 is electrical insulation and comprises at least one through-hole 19, which penetrates through the upper and lower surfaces of the insulation layer 11. The buried element 13 is fixed on the dielectric layer 12, which has at least one first opening at the bottom of the buried element 13. The first opening is filled with the conductive layer 16 so as to contact the bottom of the buried element 13.

The buried element comprises at least one passive element, active element or battery. It should be noted that FIG. 1 only illustrates single one buried element 13 for clearly explaining the aspects of the present invention, and is not intended to limit the scope of the present invention.

In addition, the buried element 13 is embedded in the insulation layer 11, and the insulation layer 11 has at least one second opening at the top of the buried element 13. The second opening is filled with the conductive layer 16 and contacts the top of the buried element 13. The first electrical circuit 14 is provided in the bottom of the insulation layer 11 and exposed to the lower surface of the insulation layer 11. In particular, the lower surface of the first electrical circuit 14 and the lower surface of the insulation layer 11 forms a co-plane, and the second electrical circuit 15 is provided in the top of the insulation layer 11 and exposed to the top surface of the insulation layer 11. The through-hole 19 in the insulation layer 11 is filled with the conductive layer 16 such that the first electrical circuit 14 and the second electrical circuit 15 are electrically connected via the conductive layer 16 in the through-hole 19. Particularly, the buried element 13 is electrically connected to the first electrical circuit 14 via the conductive layer 16 in the first opening, and/or electrically connected to the second electrical circuit 15 via the conductive layer 16 in the second opening.

More specifically, the first electrical circuit 14 is formed by performing the first patterning process on the metal layer, which is made of copper, and the second electrical circuit 15 is formed by performing the second patterning process on the thin copper layer.

The first solder mask 17 covers the bottom of the first electrical circuit 14 and the bottom of the insulation layer 11, wherein a bottom of the at least one through-hole 19 is exposed. Similarly, the second solder mask 18 covers the top of the second electrical circuit 15 and the top of the insulation layer 11, the top of the at least one through-hole 19 exposed. Preferably, the first solder mask 17 and the second solder mask 18 are formed of solder resist material.

Thus, one aspect of the above double sided board 1 of the present invention is that all the electrical elements are served as the buried elements and embedded in the insulation layer 11, and at the same time, the two surfaces of the insulation layer 11 are provided with the first electrical circuit 14 and the second electrical circuit 15, respectively, thereby implementing the double sided structure for the electrical circuit board. The elements and circuits are well protected and the operation quality of electrical signal becomes more stable. Moreover, preciseness of the circuit is greatly improved and endurance of the environment is enhanced such that the double sided board of the present invention is surely applicable to the fields requiring high reliability.

Figure 2:
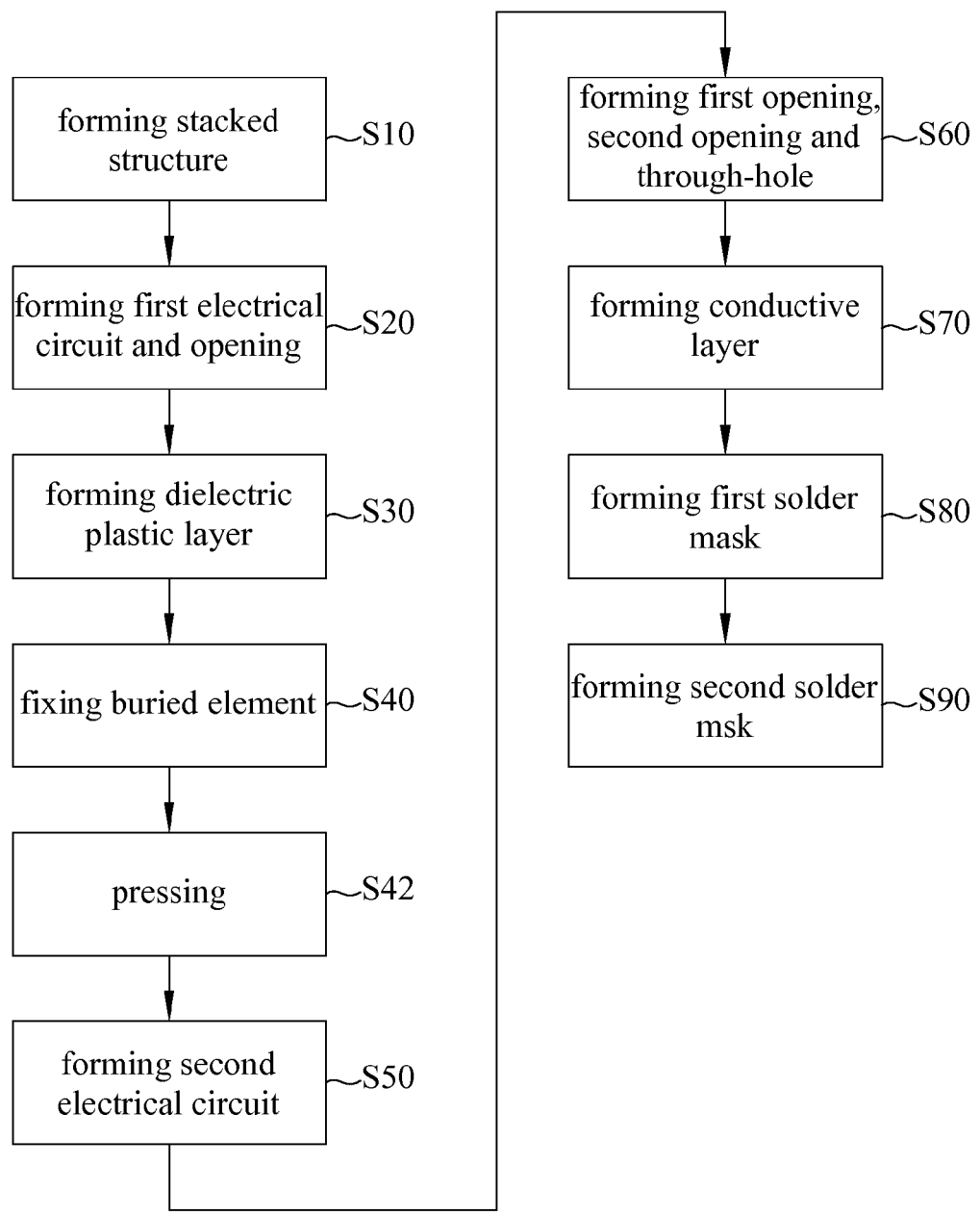
FIG. 2 is a flowchart showing the method of manufacturing double sided board with buried element according to another embodiment of the present invention.

Further refer to FIG. 2 showing the flowchart for the method of manufacturing double sided board with buried element according to another embodiment of the present invention. As shown in FIG. 2, the method of the present invention comprises the sequential steps S10, S20, S30, S40, S50, S60, S70, S80 and S90 for manufacturing the double sided board with buried element in FIG. 1. To explain the aspect of the method in detail, refer to FIGS. 3A to 3H, showing the corresponding steps.

Figure 3A:
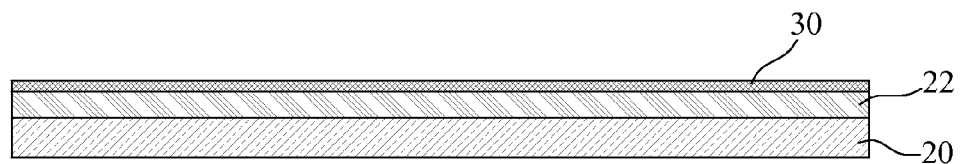
FIGS. 3A to 3H are views respectively showing the sequential processing steps of the method according to the present invention.
Figure 3B:
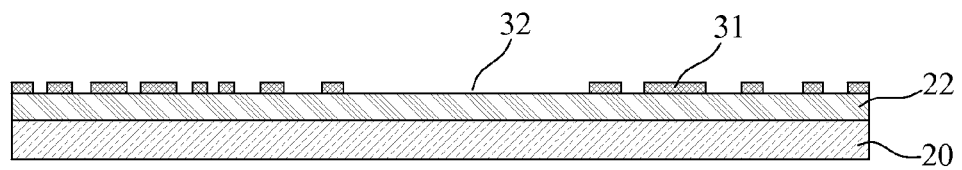
Figure 3C:
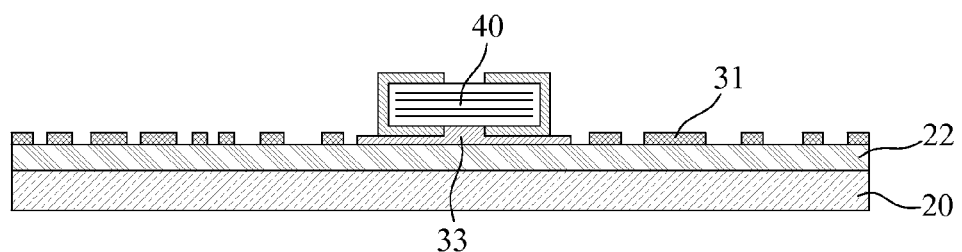

First, the copper foil layer 22 and the metal layer 30 are sequentially stacked on the substrate 20 to form a stacked structure in the step S10 (FIG. 3A). In the step S20, the metal layer 30 on the copper foil layer 22 is ten performed by the first patterning process to form the first electrical circuit 31 and the opening 32 (FIG. 3B). The step S30 is performed by forming the dielectric layer 33 on the opening 32 through the coating process, and the step S40 is performed by fixing the buried element 40 on the dielectric layer 33 (FIG. 3C). The above buried element 40 may comprise the passive element, active element or battery.

Figure 3D:
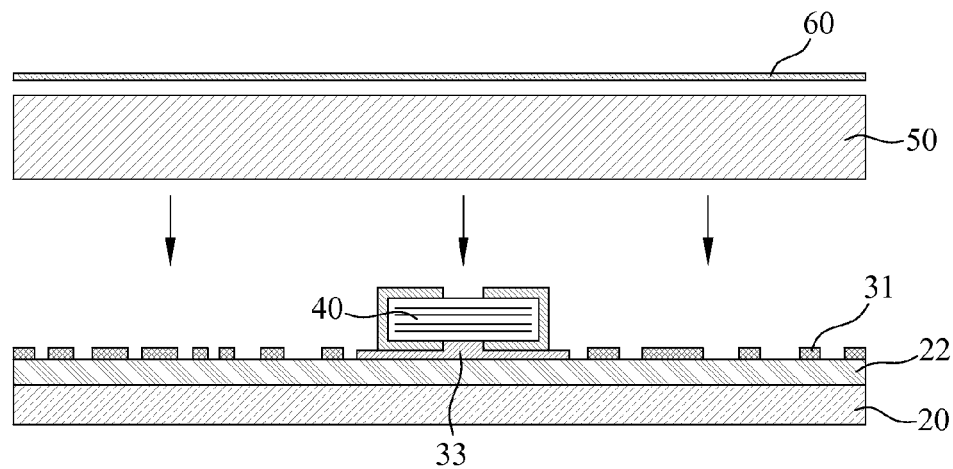
Figure 3E:
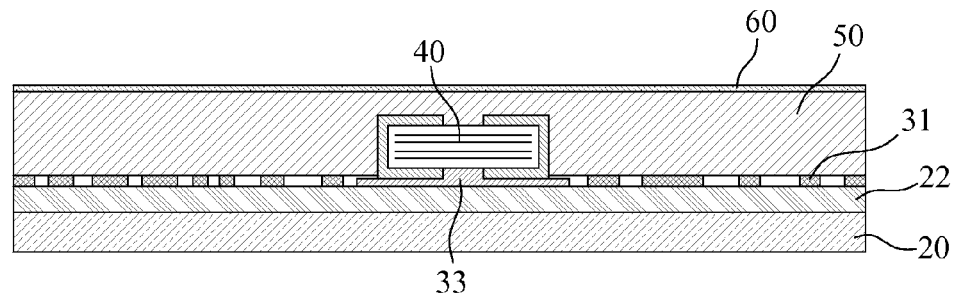
Figure 3F:
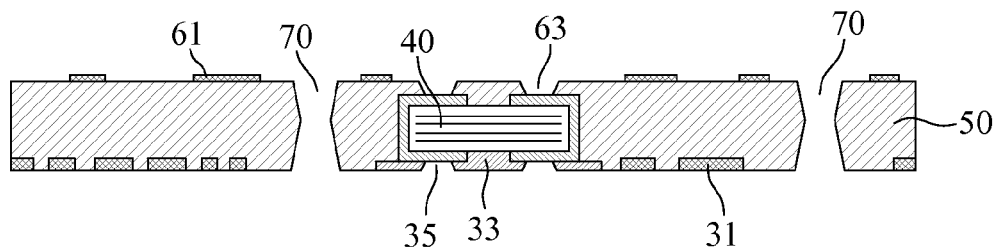

Next, the insulation layer 50 and the thin copper layer 60 are stacked together and pressed into the first electrical circuit 31 and the buried element 40 such that the buried element 40 is embedded in the insulation layer 50 and does not contact the thin copper layer 60 in the step S42 (FIGS. 3D and 3E). In the step S50, the second patterning process is performed on the thin copper layer 60 to form the second electrical circuit 61, and the substrate 10 and the copper foil layer 20 are removed. Enter the step S60. The dielectric layer 33 and the insulation layer 50 are etched to form at least one first opening 35 in the dielectric layer 33, exposing the corresponding bottom of the buried element 40, at least one second opening 63 is similarly formed in the insulation layer 50 exposing the corresponding top of the buried element 40, and at least one through-hole 70 is formed and penetrates through the insulation layer 70 from the top surface to the bottom surface (FIG. 3F).

Figure 3G:
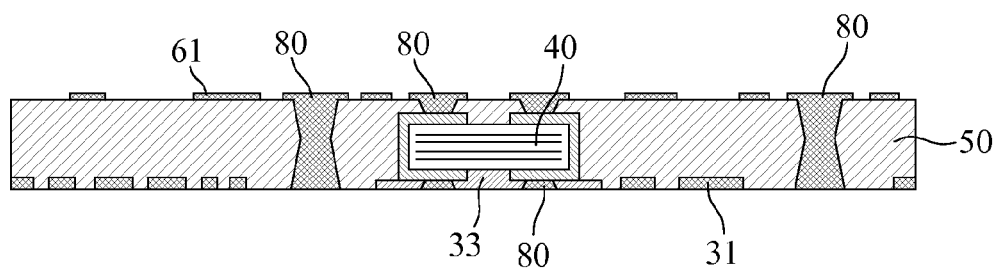

In the step S70, the conductive layer 80 is formed and covers the at least one first opening 35, the at least one second opening 63 and the through-hole 70 such that the first electrical circuit 31 is electrically connected to the second electrical circuit 61 via the conductive layer 80 in the through-hole 70 (FIG. 3G).

Figure 3H:
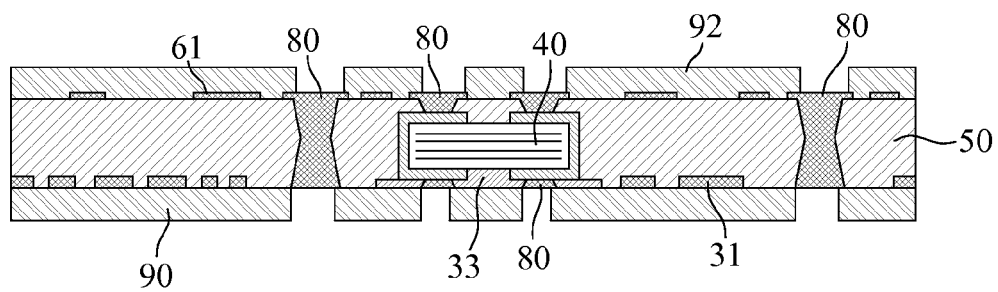

Finally, the steps S80 and S90 are performed. It should be noted that the order of the steps S80 and S90 are changeable. In other words, either the step S80 or S90 is performed first. In the present embodiment, the step S80 is performed first, and the step S90 is subsequently performed. In the step S80, the first solder mask 90 is formed to cover the first electrical circuit 31 and the bottom of the insulation 30, and expose the conductive layer 80 of the first opening 35 and the bottom of the conductive layer 80 in the through-hole 70. Similarly, the step S90 is performed by forming the second solder mask 92, which covers the second electrical circuit 61 and the top of the insulation layer 50, and further exposes the conductive layer 80 of the second opening 63 and the top of the conductive layer 80 in the through-hole 70. As a result, the double sided board with buried element of the present invention is finished (FIG. 3H).

Specifically, the above buried element 40 is electrically connected to the first electric circuit 31 via the conductive layer 80 in the first opening 35, and/or electrically connected to the second electrical circuit 61 via the conductive layer 80 in the second opening 63.

Preferably, the metal layer 30 is formed of copper, and the first solder mask 90 and the second solder mask 92 are formed of solder resist material.

From the above mention, one primary feature of the present invention is that the buried element is sandwiched between the first and second electrical circuits, and at the same time, the first and second electrical circuits are electrically connected via the conductive layer in the through-hole such that the processing steps are simplified and the manufacturing cost is reduced. Furthermore, the thickness of the product is greatly reduced, and preciseness of the circuits is improved, thereby making the circuit design more flexible and expanding the application fields.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A double sided board, comprising:
   an insulation layer being electrical insulation and comprising at least one through-hole;
   a dielectric layer;
   at least one buried element embedded in the insulation layer, a bottom of the buried element adhered to the dielectric layer, the dielectric layer having at least one first opening located at the bottom of the buried element, the insulation layer comprising at least one second opening at a top of the buried element;
   a first electrical circuit provided in a bottom of the insulation layer and exposed to a bottom surface of the insulation layer such that a bottom of the first electrical circuit and a bottom of the insulation layer form a co-plane;
   a second electrical circuit provided in a top of the insulation layer and exposed to a top surface of the insulation layer;
   a conductive layer filling the at least one through-hole of the insulation layer, wherein the conductive layer further fills the at least one first opening and the at least one second opening;
   a first solder mask covering the bottom of the first electrical circuit and the bottom of the insulation layer, wherein a bottom of the at least one through-hole is exposed; and
   a second solder mask covering a top of the second electrical circuit and the top of the insulation layer, wherein a top of the at least one through-hole is exposed.

2. The double sided board as claimed in claim 1, wherein the buried element comprises at least one passive element, active element or battery.

3. The double sided board as claimed in claim 1, wherein the first electrical circuit is formed by performing a first patterning process on a metal layer, the metal layer is formed of copper, and the second electrical circuit is formed by performing a second patterning process on a thin copper layer.

4. The double sided board as claimed in claim 1, wherein the first and second solder masks are formed of solder resist material.

5. A method of manufacturing double sided board, comprising:
   sequentially stacking a copper foil layer and a metal layer on a substrate to form a stacked structure;
   performing a first patterning process on the metal layer above the copper foil layer to form a first electrical circuit and an opening;
   forming a dielectric layer on the opening;
   fixing at least one buried element on the dielectric layer;
   stacking an insulation layer and a thin copper layer, which are pressed into the first electrical circuit and the at least one buried element, such that the at least one buried element is embedded in the insulation layer and does not contact the thin copper layer;
   performing a second patterning process on the thin copper layer to form a second electrical circuit;
   removing the substrate and the thin copper layer;
   performing an etching process on the dielectric layer and the insulation layer such that at least one first opening is formed in the dielectric layer and exposes a corresponding bottom of the buried element, at least one second opening is formed in the insulation layer and exposes a corresponding top of the buried element, and at least one through-hole is formed and penetrates through the insulation layer;
   forming a conductive layer, which covers the at least one first opening, the at least one second opening and the at least one through-hole;
   forming a first solder mask, which covers the first electrical circuit and exposes the at least one first opening and the at least one through-hole; and
   forming a second solder mask, which covers the second electrical circuit and exposes the at least one second opening and the at least one through-hole, thereby finishing a double sided board with buried element.

6. The method as claimed in claim 5, wherein the buried element comprises at least one passive element, active element or battery.

7. The method as claimed in claim 5, wherein the metal layer is formed of copper.

8. The method as claimed in claim 5, wherein the first and second solder masks are formed of solder resist material.

* * * * *